US011796849B2

(12) United States Patent
Stumpf et al.

(10) Patent No.: US 11,796,849 B2
(45) Date of Patent: Oct. 24, 2023

(54) UNIVERSAL XYZ-AXIS LEAK SENSOR

(71) Applicant: Dell Products L.P., Hopkinton, MA (US)

(72) Inventors: Michael Joseph Stumpf, Cedar Park, TX (US); Sandor T. Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 579 days.

(21) Appl. No.: 17/067,210

(22) Filed: Oct. 9, 2020

(65) Prior Publication Data
US 2022/0113219 A1    Apr. 14, 2022

(51) Int. Cl.
| | |
|---|---|
| *G02F 1/1333* | (2006.01) |
| *H05K 7/20* | (2006.01) |
| *H05K 7/14* | (2006.01) |
| *G01M 3/40* | (2006.01) |
| *H05K 1/18* | (2006.01) |

(52) U.S. Cl.
CPC .. *G02F 1/133382* (2013.01); *G02F 1/133385* (2013.01); *H05K 7/1469* (2013.01); *H05K 7/20272* (2013.01); *G01M 3/40* (2013.01); *H05K 1/189* (2013.01)

(58) Field of Classification Search
None
See application file for complete search history.

(56) References Cited

U.S. PATENT DOCUMENTS

2020/0340767 A1* 10/2020 Holden .............. H05K 7/20272
2021/0385970 A1* 12/2021 Su ...................... H05K 7/20772

* cited by examiner

*Primary Examiner* — Dung T Nguyen
(74) *Attorney, Agent, or Firm* — Chamberlain, Hrdlicka, White, Williams & Aughtry

(57) ABSTRACT

A liquid cooling subsystem and method of manufacturing a liquid cooling subsystem in an information handling system that includes a base plate, a heat exchanger mounted on the base plate, and an inlet coolant tube and outlet coolant tube operatively connected to the heat exchanger. The liquid cooling subsystem includes a liquid leak sensor disposed on the base plate that includes a main body and secondary body that each contain a plurality of sensing areas. The liquid cooling subsystem also includes electronic components for connecting and electrically detecting fluid on the plurality of sensing areas disposed on the main body. The liquid cooling subsystem also includes an opening in the main body that accommodates the heat exchanger and a split feature in the main body. The secondary body is connected to the main body along a foldable edge on an opposite side of the split feature.

20 Claims, 7 Drawing Sheets

UNIVERSAL XYZ-AXIS LEAK SENSOR

BACKGROUND

Computing devices may include any number of internal components such as processors, memory, and persistent storage. Liquid cooling of components in computing devices is becoming prevalent as the industry pushes the limits of air cooling. Because leak events have the potential to be catastrophic, there is a strong desire to build systems that can detect leaks as quickly as possible.

SUMMARY

In general, in one aspect, the invention relates to a liquid cooling subsystem in an information handling system that includes a base plate, a heat exchanger mounted on the base plate, and an inlet coolant tube and outlet coolant tube operatively connected to the heat exchanger. The liquid cooling subsystem includes a liquid leak sensor disposed on the base plate that includes a main body and secondary body that each contain a plurality of sensing areas. The liquid cooling subsystem also includes electronic components for connecting and electrically detecting fluid on the plurality of sensing areas disposed on the main body. The liquid cooling subsystem also includes an opening in the main body that accommodates the heat exchanger and a split feature in the main body. The the secondary body is connected to the main body along a foldable edge on an opposite side of the split feature.

In general, in another aspect, the invention relates to a method of manufacturing a liquid cooling subsystem in an information handling system that includes obtaining a heat exchanger mounted on a base plate, with an inlet coolant tube and outlet coolant tube operatively connected to the heat exchanger. The method includes disposing a liquid leak sensor on the base plate using a split feature. The leak sensor includes a main body and secondary body, with the main body and secondary body each containing a plurality of sensing areas. The liquid leak sensor includes an opening in the main body, and the heat exchanger is disposed in the opening of the main body.

In general, in another aspect, the invention relates to a liquid leak sensor that includes a main body and secondary body with each containing a plurality of sensing areas. The liquid leak sensor includes electronic components for connecting and electrically detecting fluid on the plurality of sensing areas disposed on the main body. The liquid leak sensor also includes an opening in the main body with the heat exchanger being disposed in the opening of the main body, and a split feature in the main body. The secondary body is connected to the main body along a foldable edge of the main body.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Figure 1:
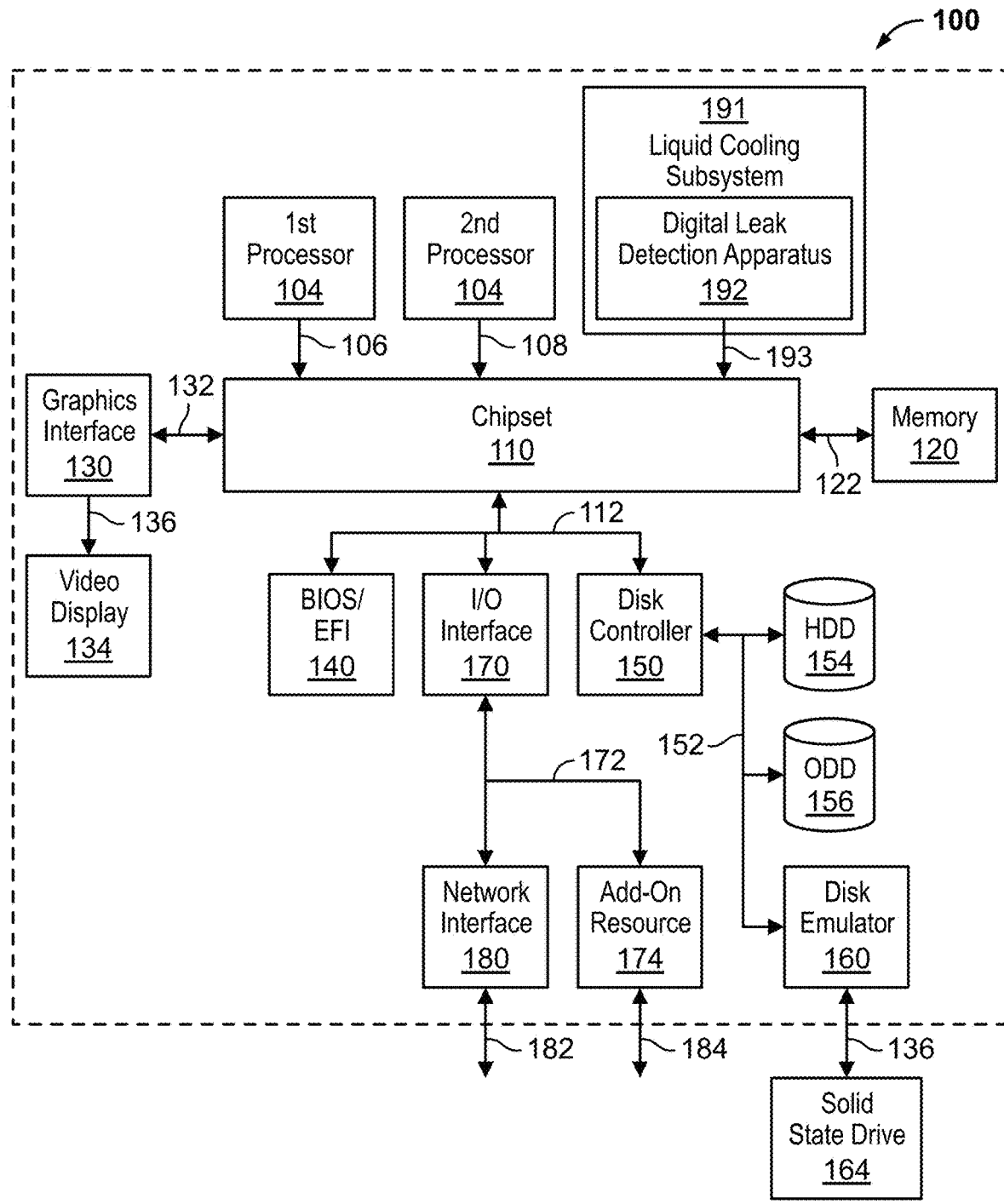
FIG. 1 shows a block diagram illustrating an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N, A to P, A to M, or A to L. As used herein, the aforementioned labeling means that the element may include any number of items and does not require that the element include the same number of elements as any other item labeled as A to N, A to P, A to M, or A to L. For example, a data structure may include a first element labeled as A and a second element labeled as N. This labeling convention means that the data structure may include any number of the elements. A second data structure, also labeled as A to N, may also include any number of elements. The number of elements of the first data structure and the number of elements of the second data structure may be the same or different.

In general, embodiments of the invention may relate to a liquid cooling subsystem and method of manufacturing a liquid cooling subsystem. The liquid cooling system includes a liquid leak sensor that may detect fluid when mounted in a horizontal or vertical direction.

As central processing unit (CPU) power continues to increase in information handling systems, liquid cooling is expected to be more common. Liquid cooling systems (or subsystems) circulate fluids (e.g., water or any other fluid(s) or liquid(s)) in a closed loop inside electronics enclosures, which include fittings and joints and hoses to complete the loop. These parts can develop leaks over time due to vibration, thermal cycles and/or aging. Any leaks would result in fluid in the system that can cause corrosion or damage to circuitry.

Current liquid leak sensors may rely on being approximately level and/or coplanar with the floor, so that gravity can pull any escaping liquid onto leak sense traces on the surface of the liquid leak sensors. Embodiments of the liquid cooling subsystem disclosed herein include an extended "drip tray" sense area to catch and detect liquid leaks when the liquid cooling subsystem is mounted in a vertical orientation (or substantially vertical orientation). Thus, embodiments of the invention may detect leaks when mounted in horizontal and vertical orientations. Embodiments of the liquid leak sensor may be made of a flexible or rigid-flexible printed circuit board (PCB) material. Embodiments of the liquid leak sensor disclosed herein include a split feature to allow installation of the liquid leak sensor onto a base plate of the liquid cooling subsystem after a heat exchanger has been installed onto the base plate. One or more embodiments disclosed herein include a cover (which may be made of plastic or any other suitable material(s)) designed to redirect liquid spray onto a sensor (see e.g., FIGS. 5A, 5B).

In embodiments disclosed herein, the liquid leak sensor is disposed between the fluid fittings and the base plate; however, the liquid leak sensor board may be installed after the assembly of the heat exchanger and base plate. This advantageously allows the sensor to be installed after the aforementioned components of the liquid cooling subsystem have been assembled.

Embodiments disclosed herein may provide leak detection for liquid cooling modular information handling systems and/or for any type of processing unit (e.g., central processing unit, graphics processing units etc.) whether they are oriented vertically, substantially vertically, horizontally, or substantially horizontally within the information handling system.

FIG. 1 illustrates a generalized information handling system (100) in accordance with one or more embodiments disclosed herein. In accordance with embodiments disclosed herein, the information handling system (100) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system (100) may be a personal computer, a laptop computer, a smart phone, a tablet device or other consumer electronic device, a network server, a network storage device, a switch router or other network communication device, or any other suitable device and may vary in size, shape, performance, functionality, and price. Further, embodiments of the information handling system (100) may include processing resources for executing machine executable code, such as a central processing unit (CPU), a programmable logic array (PLA), an embedded device such as a System-on-a-Chip (SoC), or other control logic hardware. Information handling system (100) may also include one or more computer-readable medium for storing machine-executable code, such as software or data. Additional components of information handling system (100) may include one or more storage devices that can store machine-executable code, one or more communications ports for communicating with external devices, and various input and output (I/O) devices, such as a keyboard, a mouse, and a video display. Information handling system (100) may also include one or more buses operable to transmit information between the various hardware components.

Information handling system (100) can include devices or modules that embody one or more of the devices or modules described herein. Embodiments of the information handling system (100) may include processors (e.g., 102 and 104), a chipset (110), a memory (120), a graphics interface (130), include a basic input and output system/extensible firmware interface (BIOS/EFI) module (140), a disk controller (150), a disk emulator (160), an input/output (I/O) interface (170), a network interface (180), and a liquid cooling subsystem (191). Processor (102) may be connected to chipset (110) via processor interface (106), and processor (104) may be connected to chipset (110) via processor interface (108). Memory (120) may be connected to chipset (110) via a memory bus (122). Graphics interface (130) is connected to chipset (110) via a graphics interface (132), and provides a video display output (136) to a video display (134). In one or more embodiments, the information handling system (100) may include separate memories that are dedicated to each of the processors (e.g., 102 and 104) via separate memory interfaces. An example of memory (120) includes random access memory (RAM) such as static RAM (SRAM), dynamic RAM (DRAM), non-volatile RAM (NV-RAM), or the like, read only memory (ROM), another type of memory, or a combination thereof.

In FIG. 1, BIOS/EFI module (140), disk controller (150), and I/O interface (170) may be connected to chipset (110) via an I/O channel (112). An example of I/O channel (112) includes a Peripheral Component Interconnect (PCI) interface, a PCI-Extended (PCI-X) interface, a high-speed PCI-Express (PCIe) interface, another industry standard or proprietary communication interface, or a combination thereof. Chipset (110) can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/EFI module (140) includes BIOS/EFI code operable to detect resources within information handling system (100), to provide drivers for the resources, initialize the resources, and access the resources. BIOS/EFI module (140) may include code that operates to detect resources within information handling system (100), to provide drivers for the resources, to initialize the resources, and to access the resources.

Disk controller (150) may include a disk interface (152) that connects the disc controller to a hard disk drive (HDD) (154), to an optical disk drive (ODD) (156), and to disk emulator (160). An example of disk interface (152) includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator (160) permits a solid-state drive (164) to be connected to information handling system (100) via an external interface (162). An example of external interface (162) includes a USB interface, an IEEE 1194 (Firewire) interface, a proprietary interface, or a combination thereof. Alternatively, solid-state drive (164) may be disposed within information handling system (100).

In embodiments of FIG. 1, I/O interface (170) may include a peripheral interface (172) that connects the I/O interface to an add-on resource (174) and to network interface (180). Peripheral interface (172) may be the same type of interface as I/O channel (112), or can be a different type of interface. As such, I/O interface (170) extends the capacity of I/O channel (112) when peripheral interface (172) and the I/O channel are of the same type, and the I/O interface translates information from a format suitable to the I/O channel to a format suitable to the peripheral channel (172) when they are of a different type. Add-on resource (174) may include a data storage system, an additional graphics interface, a network interface card (NIC), a sound/video processing card, another add-on resource, or a combination thereof. Add-on resource (174) may be on a main circuit board, on separate circuit board or add-in card disposed within information handling system (100), a device that is external to the information handling system, or a combination thereof.

Network interface (180) represents a NIC disposed within information handling system (100), on a main circuit board of the information handling system, integrated onto another component such as chipset (110), in another suitable location, or a combination thereof. Network interface device (180) may include network channels (e.g., 182 and 184) that provide interfaces to devices that are external to information handling system (100). In one or more embodiments, network channels (e.g., 182 and 184) are of a different type than peripheral channel (172) and network interface (180) translates information from a format suitable to the peripheral channel to a format suitable to external devices. An example of network channels (e.g., 182 and 184) includes InfiniBand channels, Fibre Channel channels, Gigabit Ethernet channels, proprietary channel architectures, or a combination thereof. Network channels (e.g., 182 and 184) may be connected to external network resources (not illustrated). The network resource may include another information handling system, a data storage system, another network, a grid management system, another suitable resource, or a combination thereof.

In accordance with embodiments disclosed herein, the liquid cooling subsystem (191) includes a digital leak detection apparatus (192). The digital leak detection apparatus (192) is connected to chipset (110) via interface (193). The digital leak detection apparatus (192) includes the fluid leak sensors (see e.g., FIG. 2) and the cover (see e.g., FIGS. 5A-5B). The liquid cooling subsystem may include other components not shown in FIG. 1.

In accordance with embodiments disclosed herein, fluid sensors (also referred to as fluid leak sensors) using a resistively driven exposed circuit board traces are assessed using digital signal processing (DSP) to detect leaks in the information handling system. In one or more embodiments, microstrip differential trace sensing elements are fabricated in the plurality of sensing areas on the fluid leak sensors. The sensing areas may be strategically placed at areas likely prone to leaks, such as near hose fittings. In embodiments disclosed herein, the fluid sensing traces of the plurality of sensing areas may not be covered by solder mask, to enable exposure to leaking coolant (e.g., fluid) and humidity from the environment. In embodiments disclosed herein, the presence of fluid affects the impedance across the traces in a detectable manner.

In one or more embodiments, a second microstrip differential element in a sensing area may be used as reference to account for variations in components, board manufacturing, and humidity changes in the environment. Such reference fluid sensing traces may be arranged where a leak is not expected.

In accordance with one or more embodiments disclosed herein, exposed traces in the sensing areas may be gold plated to prevent corrosion. Such traces may be connected to a reference potential, such as a ground voltage, so that voltages may be measured with single ended measurements from a low-cost microcontroller unit (MCU).

The traces of the sensing areas and/or reference areas may be driven from the MCU through a resistance-capacitance (RC) low-pass filter and a resistor, forming a voltage divider with the sensors areas. Fluids (such as water) are slightly conductive, so wet traces will have lower impedance. Analog-to-digital converters (ADCs) may be used to sample the voltage on the traces. MCU firmware (FW) may be executed by the MCU to monitor the change of peak voltages that correlate to impedances. The MCU has the ability to compare readings between traces on sensing areas, and provide an alert if a leak is detected.

More specifically, a drive impedance at which a transmitter, and low-pass filter, drives the traces on fluid sensor may be selected to optimize signal strength and discrimination between a high humidity level and a leak. The spacing of the differential traces may be selected to optimize signal strength and discrimination between a high humidity level and a leak.

In accordance with one or more embodiments, the sensor impedance may be dependent on fluid content (including humidity), frequency, and temperature. Embodiments disclosed herein may include sensor traces driven using a direct-current (DC) signal and/or an alternating-current (AC) signal. In embodiments, an AC signal may be advantageous to discriminate a signal obtained from a coolant leak vs. a signal obtained from high humidity.

In accordance with one or more embodiments disclosed herein, an additional receiver(s) may be provided in the liquid cooling subsystem to receive input from additional detection devices, such as twisted leak detection cables, humidity detectors, and temperature detectors. For example, a twisted leak detection cable may be used to cover remote areas of the information handling system (IHS) chassis. Embodiments disclosed herein may include an additional receiver in the liquid cooling subsystem to receive/process the signals from a twisted leak detection cable.

In accordance one or more embodiments, a transmitter drives multiple sensors with the same signal and measures them with the receivers simultaneously. In accordance with one or more embodiments, the geometry and length of the sensor traces may be matched, so that measured signals are similar, independent of humidity and temperature, unless there is a leak present. In the case of a leak, the sensors would provide unbalanced output signals and the processor may detect the difference in the amplitudes.

In an unlikely case that a large leak hits all sensors at the exact same time and covers the same amount of trace length, the readings may remain similar. However, in embodiments disclosed herein, the processor may also look at the trend of the absolute values as well, not just relative values between sensors. Slow changes in the absolute values (e.g., those occurring over seconds) may indicate humidity variations in the environment. Fast declines of signal amplitudes may indicate a large leaks covering multiple sensors. Optional humidity and temperature sensors may also be used in conjunction with the trace readings.

In accordance with one or more embodiments disclosed herein, a sensor circuit board for the digital leak detection apparatus is installed on a base plate. The coolant may contain surfactant additives to cause the liquid to spread quickly once in contact with the printed circuit board (PCB) sensor. The sensor traces of the PCB may be grouped into a plurality of zones that correspond to areas isolated from one another, for example, using a solder mask, a silk screen printing, or both on the upper surface of the circuit board to establish barriers between the areas to discourage fluid travel across zones, in order to maximize the delta between sensors.

Additional detail about the liquid cooling subsystem will be provided in FIGS. 2-5B. The skilled in the art will appreciate that the digital leak detection apparatus may implement different types of sensors without departing from the invention. Further, the invention is not limited to the structure and/or components described in FIG. 1. For example, while the information handling system in FIG. 1 shows a single instance of a digital leak detection apparatus, the invention may include multiple digital leak detection apparatus. Further, while FIG. 1 includes a digital leak detection apparatus, the leak detection apparatus is not limited to digital signal processing; rather, the invention may be implemented using analog processing without departing from the invention.

Figure 2:
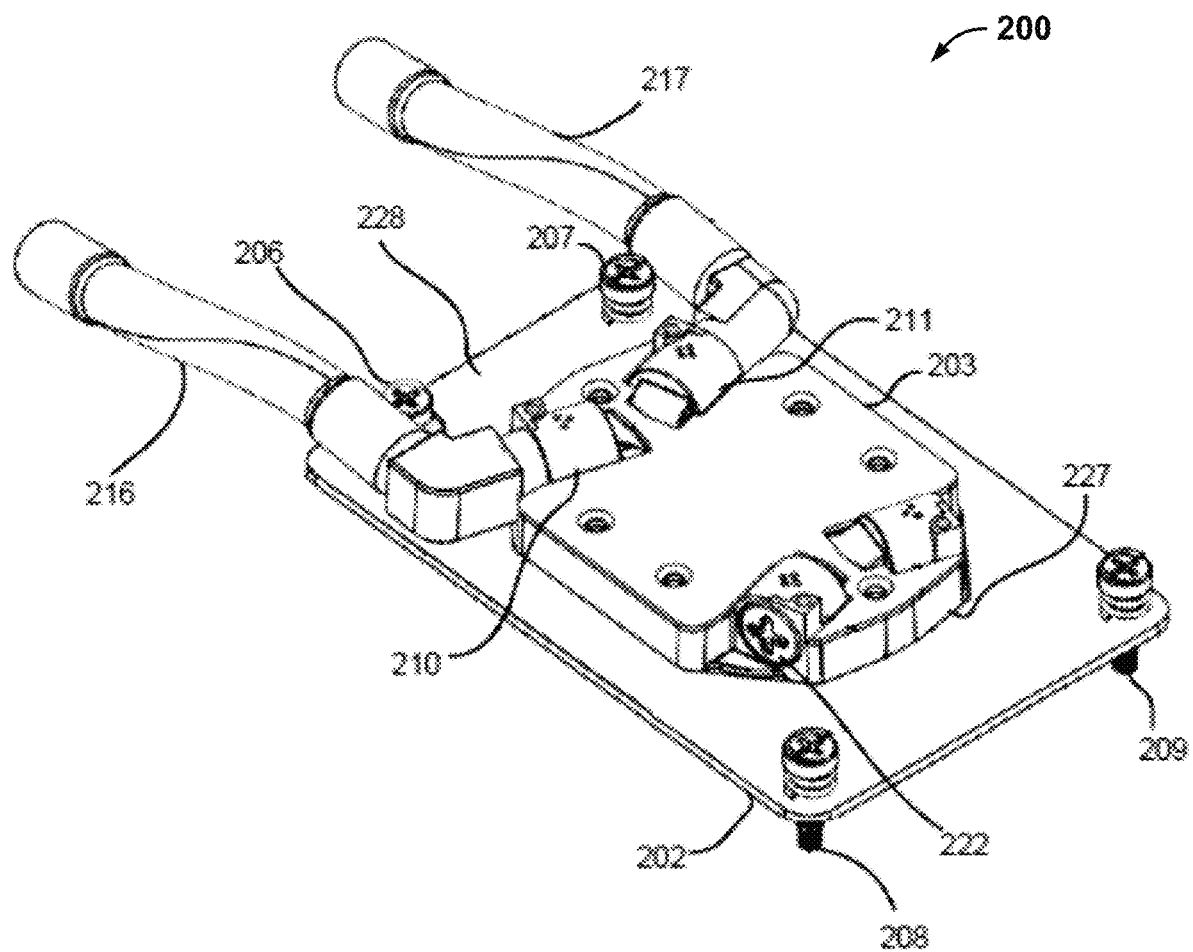
FIG. 2 shows a diagram of a component of the liquid cooling subsystem in accordance with one or more embodiments of the invention.

FIG. 2 is a diagram illustrating a liquid cooling subsystem for an information handling system in accordance with one or more embodiments disclosed herein. In embodiments disclosed herein, the liquid cooling subsystem (200) includes a base plate (202), a heat exchanger (203), and mounting screws (206, 207, 208, 209). The liquid cooling subsystem (200) includes coolant fittings (210, 211), incoming coolant tube path (216), outgoing coolant tube path (217), and coolant plug (222) in accordance with one or more embodiments disclosed herein.

The liquid cooling subsystem (200) includes an area (227) through which heat exchanger (203) extends from the base plate (202). A liquid path through the liquid cooling subsystem (200) follows incoming coolant tube path (216) (which includes cooler fluid relative to the fluid in the outgoing coolant tube path (217)), through coolant fitting 210, through heat exchanger 203, through coolant fitting 211, and continuing on outgoing coolant tube path 217 (which includes warmer fluid relative to the fluid in the incoming coolant tube path (216)). Mounting screws (206, 207, 208, and 209) may extend through holes defined in the corners of base plate (202). In addition, for example, the holes may be located through corner reliefs defined around a perimeter of embodiments described in FIG. 3. The axes of mounting screws (206, 207, 208, and 209) may be perpendicular to the plane of base plate (202).

Though not shown in FIG. 2, the components to be cooled (e.g., the CPU, GPU, etc.) by the liquid cooling subsystem may conductively coupled to the base plate (202). For example, the information handling system may include a CPU and the base plate (202) may be oriented on top of the CPU such that the heat generated by the CPU is conductively transferred to the base plate (202). The heat exchanger then transfers the heat from the base plate (202) using the coolant (which supplied to the heat exchanger via 216 and leaves the heat exchanger via 217). The warm (or hot coolant) that exits the heat exchanger (e.g., via 217) may be cooled via another heat exchanger (not shown) in the liquid cooling subsystem and/or via another heat exchanger (not shown) external to the in the liquid cooling subsystem and/or external to the information handling system.

Figure 3A:
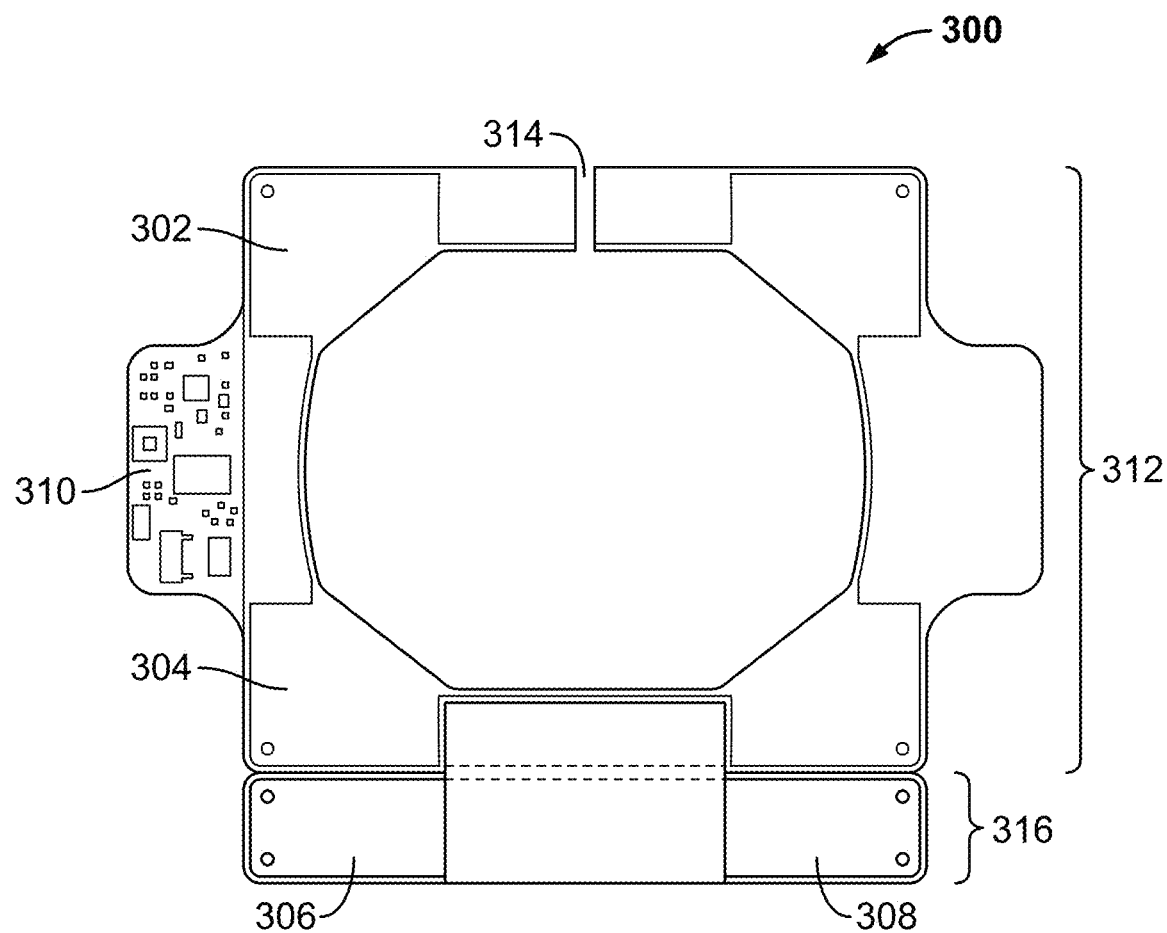
FIGS. 3A, 3B, and 3C show diagrams of a liquid leak sensor in accordance with one or more embodiments of the invention.
Figure 3B:
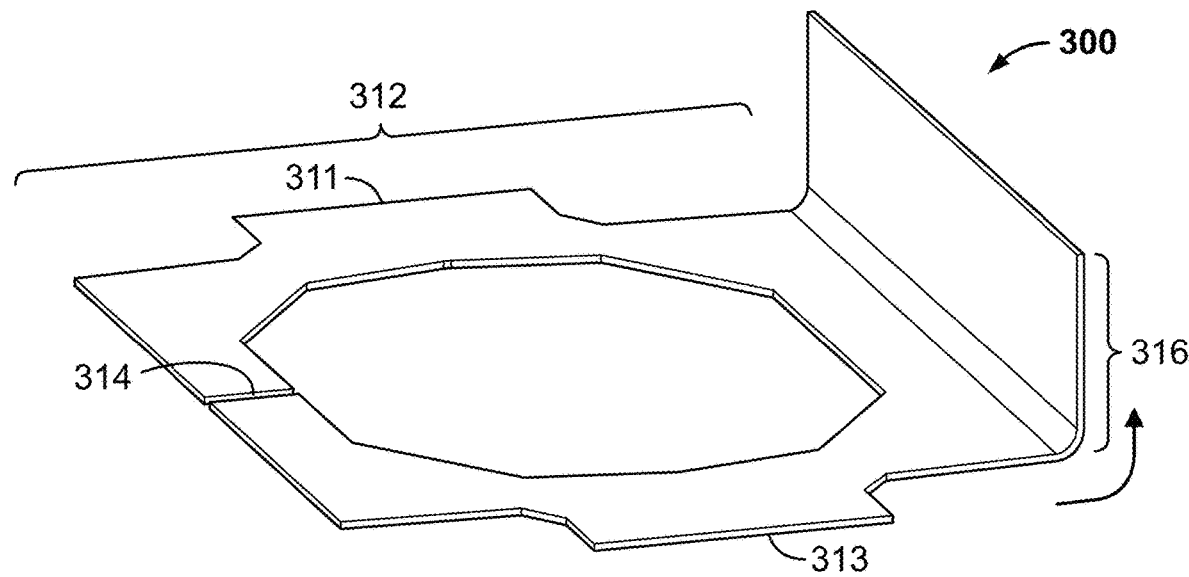
Figure 3C:
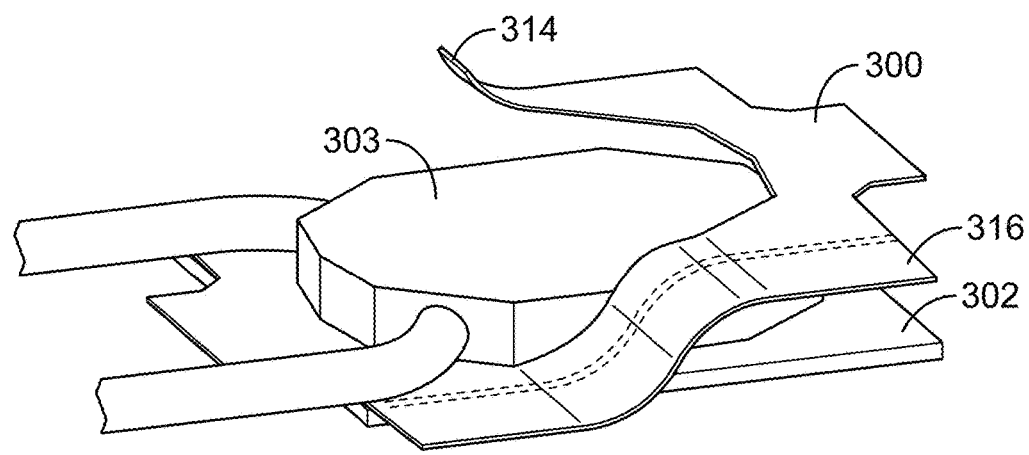

FIGS. 3A, 3B, and 3C show diagrams of a liquid leak sensor in accordance with one or more embodiments of the invention. FIG. 3A describes a liquid leak sensor board (300) in accordance with embodiments disclosed herein. The liquid leak sensor board (300) includes a main body (312) and a secondary body (316) that collectively include multiple sensing areas (302, 304, 306, 308). In one or more embodiments disclosed herein, the whole surface of the leak sensor board may include sensing areas, and embodiments are not limited to the labeled sensing areas (302, 304, 306, 308). The liquid leak sensor also includes an electronics area (310). The electronics area (310) includes electronic components for detecting fluid in the multiple sensing areas covering the surface of the liquid leak sensor board (300). The electronics area (310) also includes connectors for incorporating the liquid leak sensor board (300) into the liquid cooling subsystem.

In accordance with one or more embodiments disclosed herein, the main body (312) of the liquid leak sensor board (300) includes an open area to accommodate the heat exchanger (203), corresponding to the area (227) in FIG. 2. The main body (312) also includes a split feature (314) in accordance with embodiments disclosed herein. In one or more embodiments, the split feature (314) may be located on the opposite side of the main body (312) relative to the secondary body (316). The split feature may be located in a different portion of the main body (312) without departing from the invention. As described further in FIG. 3C, the split feature (314) allows the liquid leak sensor board (300) to be installed onto a base plate.

In accordance with one or more embodiments disclosed herein, the liquid leak sensor board (300) includes a secondary body (316). The secondary body (316) includes multiple sensing areas (e.g., 306, 308). The secondary body (316) is capable of being folded along the boundary between the main body (312) and the secondary body (316).

FIG. 3B illustrates the folding of the secondary body (316) relative to the main body (312) in accordance with one or more embodiments disclosed herein. As shown in FIG. 3B, the secondary body (316) may be folded to be substantially perpendicular to the main body (312). In this context, substantially perpendicular indicates that the angle between the main body (312) and the secondary body (316) may be 90°±10°. In some embodiments, the angle between the main body (312) and the secondary body (316) may be as close to 90° as possible. FIG. 3B illustrates the liquid leak sensor board (300) prior to the installation of the electronic components. One of ordinary skill in the art will appreciate that the electronic components may alternatively be located on either area (311) or (313) without departing from the invention.

FIG. 3C illustrates installing the liquid leak sensor board (300) onto the base plate (202) that includes the heat exchanger 303 in accordance with one or more embodiments disclosed herein. In FIG. 3C, the split feature 314 is used to install the liquid leak sensor board (300) onto the base plate (202) in a manner surrounding the heat exchanger 303. This allows the liquid leak sensor board (300) to be installed separately from the manufacturing of the base plate/heat exchanger assembly, as described in FIG. 4 below. In some embodiments, the liquid leak sensor board (300) may be installed prior to folding the secondary body (316), to reduce the stress on liquid leak sensor board (300) during installation. Although FIG. 3C shows the installation of the liquid leak sensor board (300) without the electronic components, the electronic components may be fabricated onto the liquid leak sensor board prior to installation onto the base plate (202). The liquid leak sensor board may be fixed to the base plate (202) using known techniques, for example through the use of an adhesive.

Figure 4:
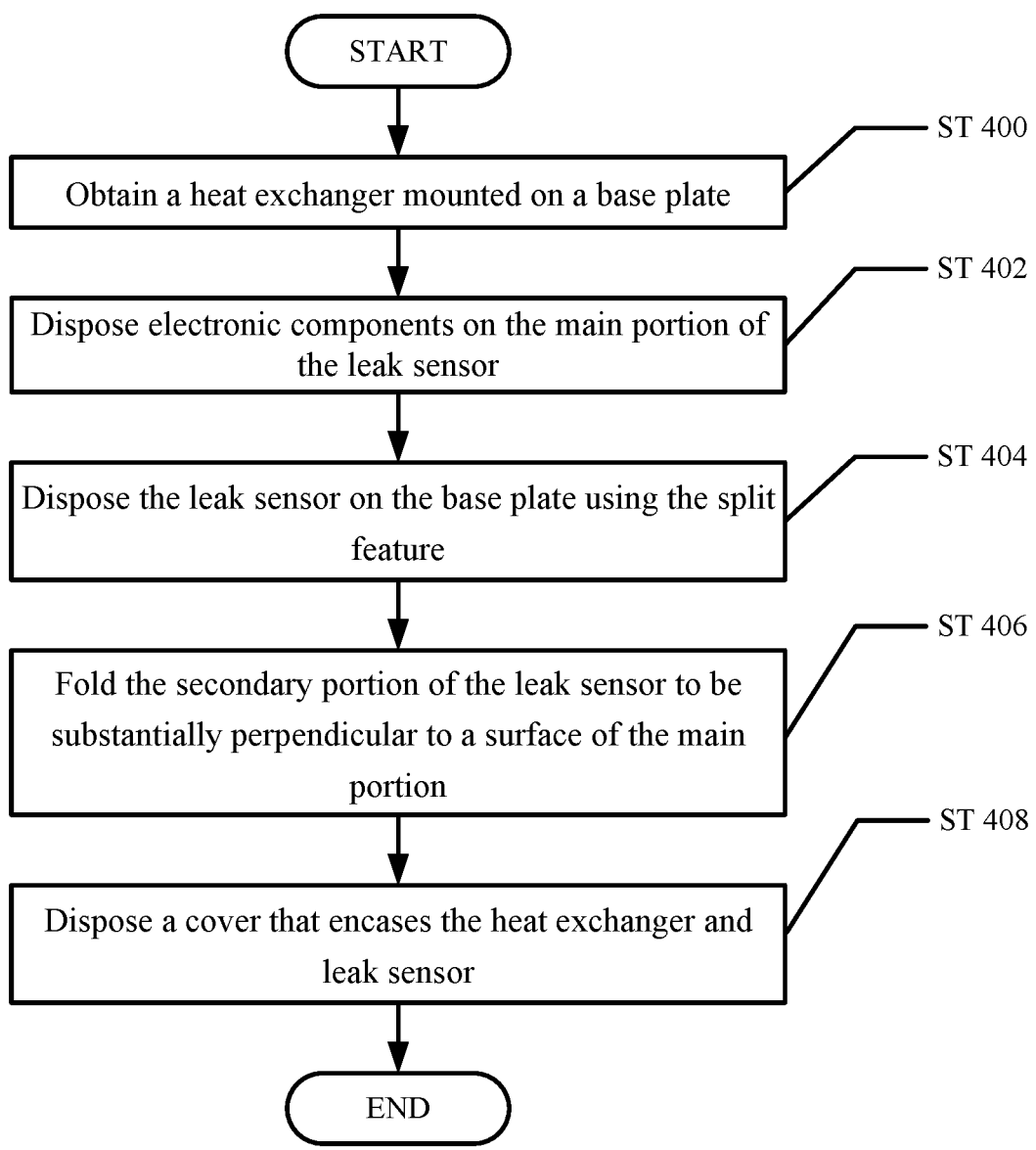
FIG. 4 shows a method in accordance with one or more embodiments of the invention.

FIG. 4 illustrates a method of manufacturing a liquid cooling subsystem in accordance with one or more embodiments disclosed herein. In ST 400, a heat exchanger/base plate assembly is obtained. In accordance with one or more embodiments, the heat exchanger/base plate assembly, as demonstrated in FIG. 2, may be fabricated separately given the manufacturing facilities and considerations necessary to fabricate such an assembly. This advantageously allows the liquid leak sensor to be added separately, without needing to be incorporated in the base plate/heat exchanger fabrication process. Such embodiments allow for the liquid leak sensor to be installed in a separate location and facility than that of the base plate/heat exchanger assembly.

In ST 402, the electronic components are disposed onto the main body of the liquid leak sensor. ST 402 is not limited to being performed prior to disposing the liquid leak sensor on the base plate. One of ordinary skill in the art will appreciate that the electronic components may be installed onto the liquid leak sensor at any time prior to the installation of the cover.

In ST 404, the liquid leak sensor is disposed onto the base plate using the split feature. As described in FIG. 3C, the split feature is used to install the liquid leak sensor onto the base plate around the heat exchanger. The liquid leak sensor may then be fixed to the base plate using an adhesive or the like.

In ST 406, the secondary body of the liquid leak sensor is then folded to be substantially perpendicular to the surface of the main body of the liquid leak sensor. Although not required, the secondary body may be folded subsequent to disposing the liquid leak sensor onto the base plate to reduce the strain on the liquid leak sensor when exploiting the split feature. The liquid leak sensor may be a PCB designed for a one-time fold of the secondary body.

In ST 408, a cover is disposed that encases the heat exchanger and liquid leak sensor. As demonstrated below with respect to FIG. 5, the second portion of the liquid leak sensor may be arranged to coincide with a surface of the cover. This may contribute to the overall mechanical stability of the liquid cooling subsystem, as well as the detection of fluid when mounted in a vertical orientation. The operation of the cover in the detection of leaks is described in FIGS. 5A-5B.

Figure 5A:
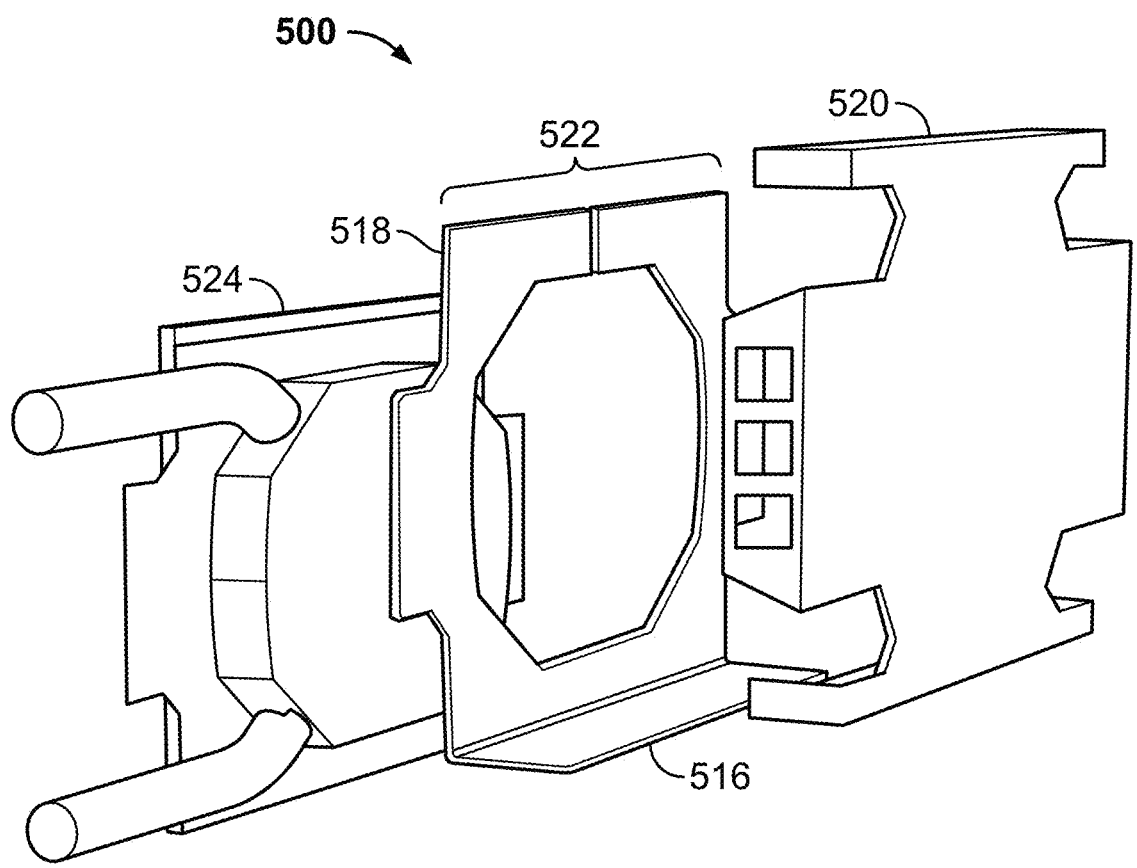
FIGS. 5A and 5B show diagrams of a liquid cooling subsystem in accordance with one or more embodiments of the invention.
Figure 5B:
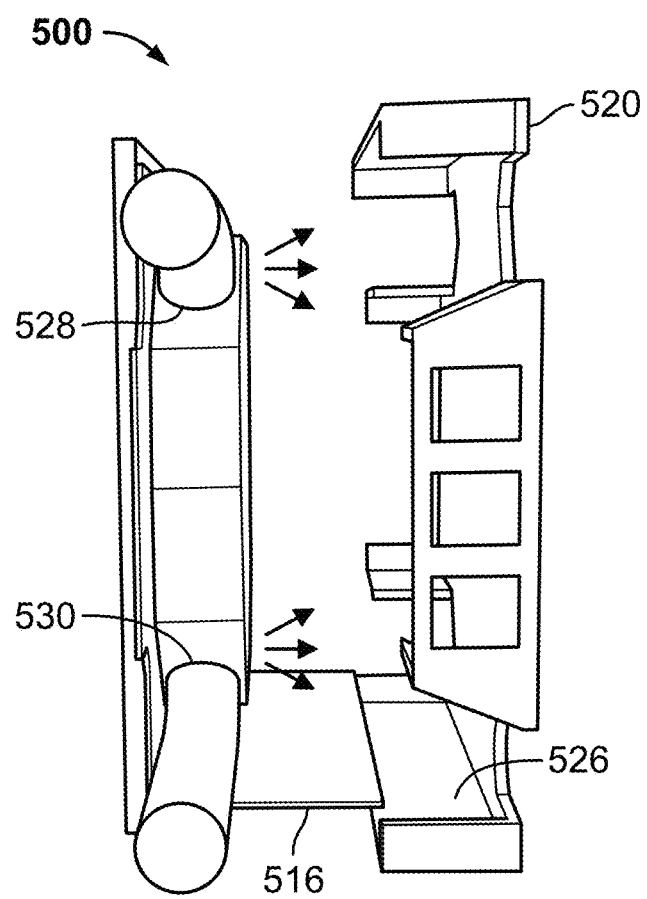

FIGS. 5A and 5B show diagrams of a liquid cooling subsystem in accordance with one or more embodiments of the invention. Although FIGS. 5A and 5B show the liquid cooling subsystem 500 in a vertical orientation, embodiments are not limited as such. Further, various other elements of the liquid cooling subsystem have been omitted for clarity.

In this example, a vertical orientation refers to the liquid cooling subsystem being orientated such that the secondary body of the liquid leak sensor is parallel to a mounting surface. Similarly, a horizontal orientation refers to the liquid cooling subsystem being orientated such that the base plate and main body of the liquid leak sensor are parallel to the mounting surface. In the embodiments disclosed herein, the orientation of the liquid cooling subsystem is set such that gravity will facilitate any fluid or moisture reaching the liquid leak sensor.

In accordance with one or more embodiments disclosed herein, the liquid cooling subsystem (500) includes a cover (520), the liquid leak sensor (522) (with a main body (518) and a secondary body (516)), and the base plate/heat exchanger assembly (524). FIG. 5A broadly illustrates embodiments of the methods described in FIG. 4. More specifically, FIG. 5A shows the relatively location and orientation of the liquid cooling subsystem (500).

FIG. 5B illustrates aspects of the cover in accordance with one or more embodiments disclosed herein. As shown in FIG. 5B, the cover (520) includes an area (526) designed to accommodate the secondary body (516) of the liquid leak sensor (522). In one or more embodiments, the secondary body (516) may be fixed to the area (526) of the cover. This may be achieved through the use of adhesives, or by providing slots on the cover so that the secondary body may slide into the cover.

In accordance with one or more embodiments disclosed herein, the cover (520) may facilitate fluid or moisture contacting the liquid leak sensor. For example, referring to FIG. 5B, if a leak (arrows) occurs at near the connection associated with the fluid path (528, 530), fluid may spray and, as a result, impact (or otherwise come in contact with) the cover (520) causing the fluid to flow down inside the cover (520) to the secondary body (516) of the liquid leak sensor (516). In one or more embodiments disclosed herein, the inside of the cover may have a smooth surface to facilitate the flow of fluid in the direction of the secondary body of the liquid leak sensor when the subsystem is mounted in a vertical orientation. In some embodiments, the surface inside the cover may be made to be hydrophobic to facilitate the flow of fluid.

Embodiments disclosed herein have the advantage of functioning in both a horizontal or vertical mounting position. Embodiments also have the advantage of installing the liquid leak sensor separately from the base plate fabrication, while staying within the base plate footprint.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A liquid cooling subsystem in an information handling system, comprising:
   a base plate;
   a heat exchanger mounted on the base plate;
   an inlet coolant tube and outlet coolant tube operatively connected to the heat exchanger;
   a liquid leak sensor disposed on the base plate, the liquid leak sensor further comprising:
   a main body and secondary body, wherein the main body and secondary body each contain a plurality of sensing areas;
   electronic components for connecting and electrically detecting fluid on the plurality of sensing areas disposed on the main body;
   an opening in the main body, wherein the heat exchanger is disposed in the opening of the main body; and
   a split feature in the main body;
   wherein the secondary body is connected to the main body along a foldable edge on an opposite side of the split feature.

2. The liquid cooling subsystem of claim 1,
   wherein a surface of the secondary body is substantially perpendicular to a surface of the main body when the secondary body is in a folded position.

3. The liquid cooling subsystem of claim 1, further comprising:

a cover encasing the heat exchanger and liquid leak sensor, wherein the secondary body of the liquid leak sensor is parallel to at least one surface of the cover.

4. The liquid cooling subsystem of claim 3, wherein the cover comprises an inside surface that facilitates a flow of fluid towards the secondary body of the liquid leak sensor.

5. The liquid cooling subsystem of claim 1, wherein the liquid leak sensor is a flexible printed circuit board (PCB).

6. The liquid cooling subsystem of claim 1, wherein each of the plurality of sensing areas detects fluid using a transmitted waveform across the plurality of sensing areas and digital signal processing across the plurality of sensing areas.

7. The liquid cooling subsystem of claim 1, wherein each of the plurality of sensing areas comprises a plurality of traces for detecting fluid.

8. A method of manufacturing a liquid cooling subsystem in an information handling system, the method comprising:
obtaining a heat exchanger mounted on a base plate, wherein an inlet coolant tube and outlet coolant tube are operatively connected to the heat exchanger;
disposing a liquid leak sensor on the base plate using a split feature, the liquid leak sensor comprising:
a main body and secondary body, wherein the main body and secondary body each contain a plurality of sensing areas,
wherein the liquid leak sensor comprises an opening in the main body, and the heat exchanger is disposed in the opening of the main body.

9. The method of claim 8, further comprising:
disposing electronic components on the main body for connecting and electrically detecting fluid on the plurality of sensing areas.

10. The method of claim 8, further comprising:
folding the secondary body to be substantially perpendicular to a surface of the main body.

11. The method of claim 8, further comprising:
disposing a cover that encases the heat exchanger and liquid leak sensor, wherein the secondary body of the liquid leak sensor is parallel to at least one surface of the cover.

12. The method of claim 11, wherein the secondary body of the liquid leak sensor is fixed to at least one surface of the cover.

13. The method of claim 8, further comprising:
transmitting a waveform across each of the plurality of sensing areas; and
digital signal processing the transmitted waveforms across the plurality of sensing areas to detect fluid on at least one sensing area.

14. The method of claim 8, wherein each of the plurality of sensing areas comprises a plurality of traces for detecting fluid.

15. A liquid leak sensor comprising:
a main body and secondary body, wherein the main body and secondary body each contain a plurality of sensing areas;
electronic components for connecting and electrically detecting fluid on the plurality of sensing areas disposed on the main body;
an opening in the main body, wherein a heat exchanger is disposed in the opening of the main body; and
a split feature in the main body,
wherein the secondary body is connected to the main body along a foldable edge of the main body.

16. The liquid leak sensor of claim 15, wherein the secondary body is connected to the main body along a foldable edge on an opposite side of the split feature.

17. The liquid leak sensor of claim 15,
wherein a surface of the secondary body is substantially perpendicular to a surface of the main body when the secondary body is in a folded position.

18. The liquid leak sensor of claim 15,
wherein the liquid leak sensor is a flexible printed circuit board (PCB).

19. The liquid leak sensor of claim 15,
wherein each of the plurality of sensing areas detects fluid using a transmitted waveform across the plurality of sensing areas and digital signal processing across the plurality of sensing areas.

20. The liquid leak sensor of claim 15, wherein each of the plurality of sensing areas comprises a plurality of traces for detecting fluid.

\* \* \* \* \*